United States Patent [19]

Ernst

[11] Patent Number: 4,477,189
[45] Date of Patent: * Oct. 16, 1984

[54] PHOTOELECTRIC INCREMENTAL MEASURING DEVICE

[75] Inventor: Alfons Ernst, Traunreut, Fed. Rep. of Germany

[73] Assignee: Johannes Heidenhain GmbH, Traunreut, Fed. Rep. of Germany

[*] Notice: The portion of the term of this patent subsequent to Sep. 13, 2000 has been disclaimed.

[21] Appl. No.: 347,301

[22] Filed: Feb. 9, 1982

[30] Foreign Application Priority Data

Feb. 12, 1981 [DE] Fed. Rep. of Germany ....... 3104972

[51] Int. Cl.$^3$ .............................. G01D 5/245
[52] U.S. Cl. .............................. 356/374; 250/237 G; 33/125 C
[58] Field of Search ......... 356/374; 33/125 A, 125 C; 250/237 G, 231 SE

[56] References Cited

U.S. PATENT DOCUMENTS

| | | | |
|---|---|---|---|
| 2,955,283 | 10/1960 | Busch-Keiser | 250/231 SE |
| 3,544,800 | 12/1970 | Elliott | 250/231 SE |
| 3,985,448 | 1/1980 | Wiklund et al. | |
| 4,101,764 | 7/1978 | Nelle | 250/237 G |
| 4,184,071 | 1/1980 | Fryer et al. | 250/237 G |
| 4,363,964 | 12/1982 | Schmitt | 250/237 G |
| 4,369,366 | 10/1980 | Schmitt | |
| 4,403,859 | 9/1983 | Ernst | 250/237 G |

FOREIGN PATENT DOCUMENTS

| | | |
|---|---|---|
| 876162 | 7/1952 | Fed. Rep. of Germany . |
| 1814785 | 12/1968 | Fed. Rep. of Germany . |
| 2454915 | 11/1974 | Fed. Rep. of Germany . |

OTHER PUBLICATIONS

Ernst, Neuere Entwicklungen bei Fotoelektrischen Längenmessgeräten, Jun., 1974 pp. 371–374, Messen+-Prufen/Automatik.

Ernst, Neuere Entwicklungen bei Fotoelektrischen Längenmessgeräten, Jul./Aug. 1974, pp. 435–438.

Primary Examiner—R. A. Rosenberger
Attorney, Agent, or Firm—Willian Brinks Olds Hofer Gilson & Lione Ltd.

[57] ABSTRACT

An incremental measuring device is described which includes a measuring scale and a scanning unit. The measuring scale includes a division grid, a reference track which includes a plurality of reference marks, and a control track which includes a plurality of control regions. Each of the control regions is associated with a respective one of the reference marks, but the precise alignment between each reference mark and its respective control region is unique. The scanning unit includes a scanning plate which defines two separate scanning regions for scanning separate portions of the scale. Each scanning region defines reading fields for reading the division grid as well as a reference track reading field and a control track reading field. The precise alignment between the reference track reading field and the control track reading field of each of the scanning regions is different such that, for each of the scanning regions, there is only a single position of the scale with respect to the scanning plate which produces simultaneous alignment between the reference track reading field and one of the reference marks and the control track reading field and one of the control regions. In the disclosed embodiment photosensitive elements are associated with each of the reference track and control track reading fields, and each produces a respective signal. The four signals are summed in an analog manner to produce a composite signal which unambiguously indicates when the measuring scale is in a single, preselected position with respect to the scanning plate. In this embodiment, when one of two light sources included in the scanning unit fails such that scanning of one of the two scanning regions is interrupted, the device still functions to generate a reference signal unambiguously when the measuring scale reaches the predetermined position with respect to the scanning plate.

5 Claims, 6 Drawing Figures

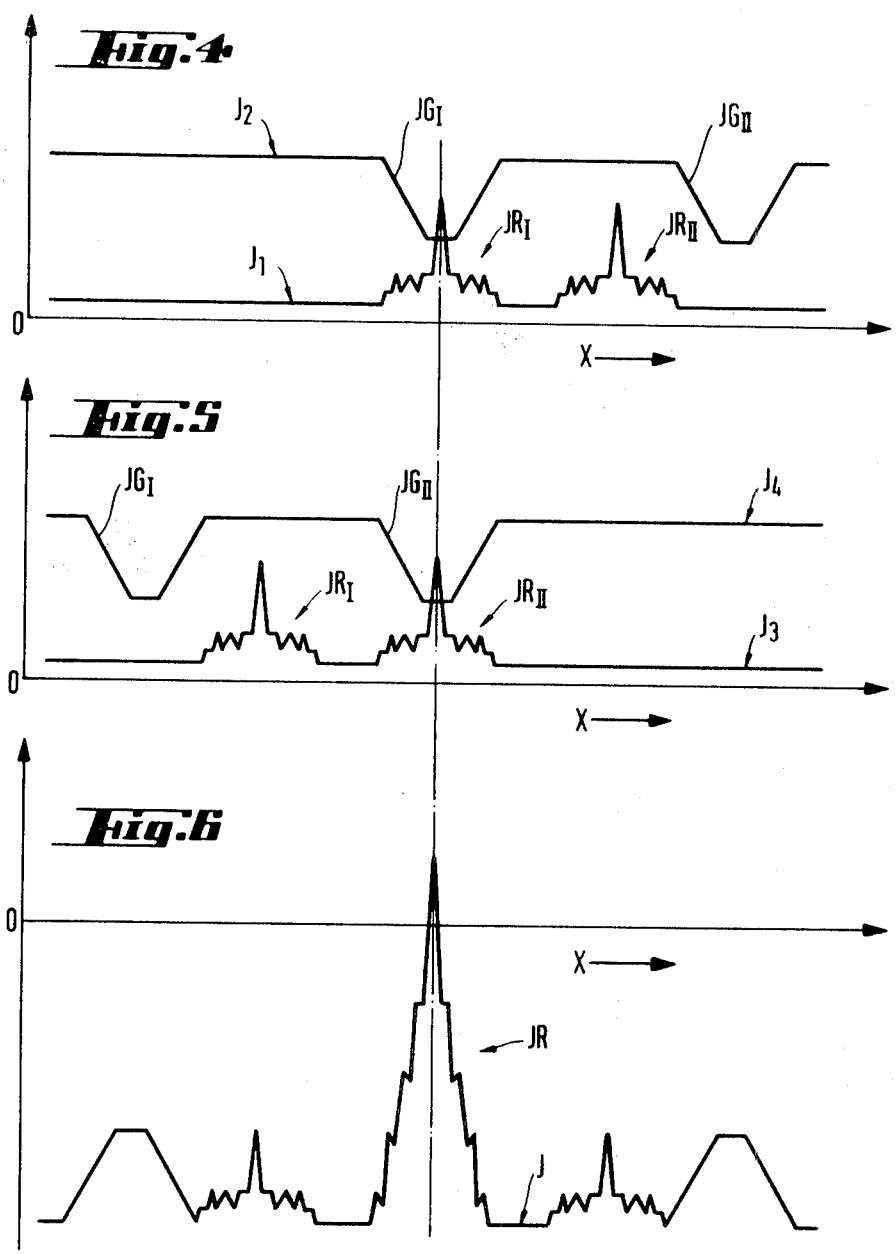

PHOTOELECTRIC INCREMENTAL MEASURING DEVICE

BACKGROUND OF THE INVENTION

This invention relates to improvements in photoelectric incremental measuring devices for measuring the position of a first object relative to a second object. In particular, this invention relates to improvements in measuring devices of the type which include a scale having a division grid and at least first and second reference marks spatially separated along the grid, each of the reference marks comprising a group of irregularly spaced reference lines, and wherein the device further includes a scanning plate having at least two scanning regions, each having a plurality of reading fields for reading the scale.

Measuring devices of this general type are known to the art. In West German unexamined patent specification OS No. 18 14 785, for example, there is described a photoelectric length measuring device in which the measuring scale defines both an incremental division grid as well as a reference mark. This document presents and describes in some detail the functioning of the disclosed measuring device. Furthermore, the functioning and construction of the reference mark is described in detail, particularly in connection with FIG. 2.

It is also known to the art, as for example in West German Pat. No. 876 162, that particularly useful reference marks are provided if each reference mark is made up of a number of lines arranged in a line group, and the separations between adjacent lines in each line group are unequal. When such reference marks are used, the scanning plate used to detect these marks includes a reading field having a line group with the same line distribution as that of the reference mark being detected. When exact and complete overlap is obtained between such a reference mark and the matching reading field, the intensity of light transmitted through the scanning plate and the measuring scale reaches a sufficiently high value to distinguish it unambiguously from noise. Thus, reference marks and corresponding reading fields of the type described above provide the advantage of particularly high signal-to-noise ratios.

It is well known that incremental measuring devices exhibit the potentially significant problem that once the operation of the device has been interrupted the absolute position of the measuring device cannot be directly recovered. West German unexamined patent specification OS No. 18 14 785 describes a structure and procedure for recalibrating an incremental measuring device in a particularly simple manner after operation has been interrupted.

Known photoelectric incremental measuring devices include at least one light source for illuminating the measuring scale and the scanning plate. When this light source fails to operate properly (as for example when the filament of an incandescent lamp breaks) the operation of the measuring device is interrupted, and this can lead to substantial delays while the lamp is replaced and the measuring device is recalibrated.

SUMMARY OF THE INVENTION

The present invention is directed to an improved incremental measuring device in which the failure of a light source does not noticeably disturb operation of the measuring device, and which operates with excellent accuracy.

According to this invention, an incremental photoelectric measuring device of the type described above is provided with a control track, included in the scale. This control track has at least first and second spatially separated control regions, each of which has optical characteristics which differ from a remaining portion of the control track. Each of the control regions is positioned on the scale in association with a respective one of the reference marks, and the alignment of the first control region with respect to the first reference mark differs from the alignment of the second control region with respect to the second reference mark. In addition, at least first and second control track reading fields are provided, each in a respective one of the scanning regions of the scanning plate. The control track reading fields are so positioned with respect to the reference mark reading fields that each set of a reference mark reading field and the associated control track reading field can be simultaneously aligned with only a single selected set of a reference mark and its associated control region.

As will be explained below, an important advantage of the preferred embodiment of this invention is that even when one of two illuminating systems has failed, the measuring device will still unambiguously generate a reference signal with a suitably high signal-to-noise ratio in response to the reference mark at the appropriate alignment of the scale and the scanning plate. Furthermore, means are described which allow the changes in reference signal level caused by the failure of a light source to be compensated to the greatest possible extent. Further features of this invention are defined in the dependent claims, and the advantages of these features are described below.

The invention itself, together with further objects and attendant advantages, will best be understood by reference to the following detailed description taken in conjunction with the accompanying drawings.

BRIEF DESCRIPTION OF THE DRAWINGS

FIG. 4 is a wave form diagram showing signals generated at a first scanning region included in the embodiments of FIGS. 1 through 3.

FIG. 5 is a wave form diagram showing signals generated at a second scanning region included in the embodiments of FIGS. 1 through 3.

FIG. 6 is a wave form diagram illustrating the manner in which the wave forms of FIGS. 4 and 5 can be combined in order to unambiguously generate a combined reference signal.

DETAILED DESCRIPTION OF THE PRESENTLY PREFERRED EMBODIMENTS

Figure 1:
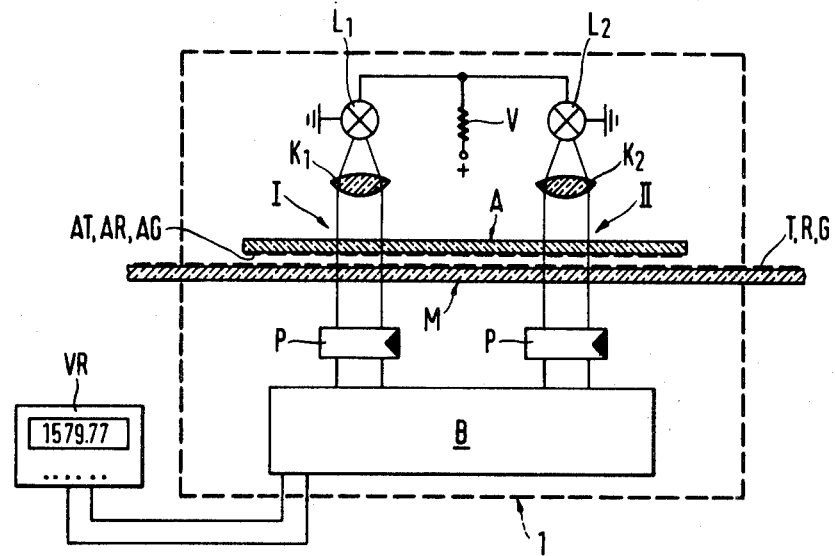
FIG. 1 is a schematic representation of a linear incremental photoelectric measuring device which incorporates a first preferred embodiment of this invention.

Turning now to the drawings, FIG. 1 shows a schematic representation of a first preferred embodiment of this invention. In FIG. 1, two lamps $L_1$ and $L_2$ are mounted on a scanning unit 1. The lamps $L_1$ and $L_2$ are secured to the scanning unit 1 at a constant, predetermined separation from one another, and are powered from a voltage source by means of a common resistor V. Thus, the current passing through resistor R is equal to the sum of the current passing through lamp $L_1$ and the current passing through lamp $L_2$. The lamps $L_1, L_2$ are positioned such that each illuminates a respective scanning region I,II via a respective condenser lens $K_1, K_2$. The device of FIG. 1 also includes a measuring scale M which defines three separate tracks: a division grid T which forms an incremental measuring grid, a reference track R which defines two reference marks $R_I$ and $R_{II}$, and a control track G which defines two control regions or constrictions $G_I$ and $G_{II}$. The scanning unit 1 includes a scanning plate A which defines the two scanning regions I,II. Within each of the scanning regions I,II, the scanning plate A includes respective grid division reading fields AT, a reference mark reading field AR, and a control track reading field AG. The scanning unit 1 is mounted to slide longitudinally along the length of the measuring scale M. As the scanning unit 1 moves relative to the measuring scale M, the scanning plate A is guided along the division grid T in a known manner. The light flux proceeding from the lamps $L_1$ and $L_2$ passes through both the scanning plate A and the scale M. Light which penetrates the scanning plate A and the scale M is modulated by light and dark fields included on the two elements A and M in a known manner. The modulated light flux strikes photosensitive elements P, which are mounted on the scanning unit 1 and which generate photoelectric signals which are processed at an evaluating unit B. The evaluating unit B operates to control an up/down counter VR in a known manner, such that the up/down counter VR indicates the position of the scanning plate A with respect to the scale M digitally. The signals generated by means of the reference marks $R_I, R_{II}$ are used to calibrate or correct the value displayed by the up/down counter VR.

It is well known that leading and lagging signals can be generated from the division grid T in order to facilitate up/down counting. Since this technique is thoroughly presented in a number of publications in this field, details of the manner in which the up/down counter VR is controlled will not be described here or in the figures. Similarly, it is well known that the evaluating unit B can include means for eliminating asymmetrical components of the signals generated by the photosensitive elements P in response to the division grid T in order to improve the accuracy of the measurement. Here, it will only be mentioned that for these purposes a number of separate reading fields AT are provided in each scanning region I,II, and that respective photosensitive elements are provided to scan the incremental division T through these reading fields AT. The output of these photosensitive elements is processed by circuitry included in the evaluating unit B and known to those skilled in the art. In order better to focus this description on the novel features which embody the present invention, this discussion will not deal with such known features in greater detail.

Figure 2:
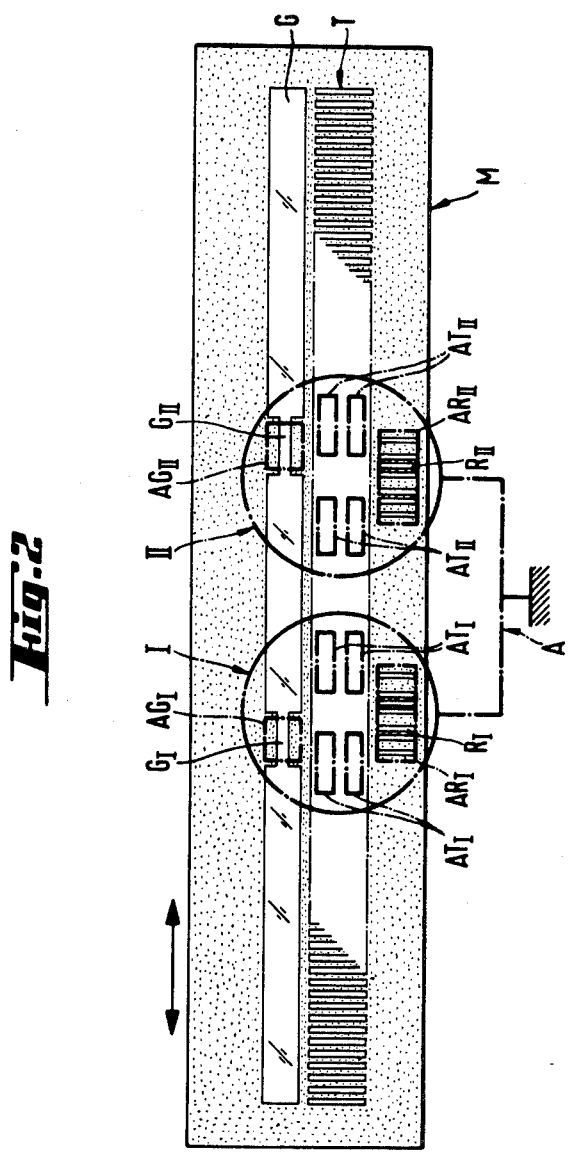
FIG. 2 is a schematic representation of the scanning plate and measuring scale of the embodiment of FIG. 1.

FIG. 2 shows the relative positions of the reading fields AT, AR and AG. As will be explained in detail below, these reading fields AT, AR and AG must be precisely positioned with respect to one another since the outputs of the photosensitive elements which scan these fields are summed by analog addition. This approach yields increased precision of measurement, since in this manner a larger total area of the division grid T can be scanned. In this way smudges on the division grid T have a significantly reduced effect on the accuracy of the measurement.

FIG. 2 shows the measuring scale M which includes an incremental division grid T having a well defined grid constant. The second track included on the scale M is the reference track R which includes two reference marks $R_I$ and $R_{II}$. Preferably, each of the reference marks $R_I$ and $R_{II}$ consists of a group of parallel lines, wherein the distribution of the lines within each group is irregular. It is important that the reference marks $R_I$ and $R_{II}$ have a clear, unambiguous distribution of lines. The distribution of the line groups of both reference marks $R_I$ and $R_{II}$ are in this preferred embodiment identical.

In addition, the measuring scale M includes a third track, the control track G which is used for the generation of a control signal. This control track G defines two control regions, or constrictions $G_I$ and $G_{II}$. Each of these constrictions $G_I$ and $G_{II}$ is positioned near and is associated with a respective one of the reference marks $R_I, R_{II}$. The scanning unit includes photosensitive elements (not shown) for generating control signals proportional to the intensity of light passed by the control track G through the respective reading fields $AG_I, AG_{II}$. As will be explained in detail below, the constrictions $G_I, G_{II}$ cause modulation of the control signals generated by the respective photosensitive elements (not shown), and these control signals are electrically summed with the respective reference signals.

Figure 3:
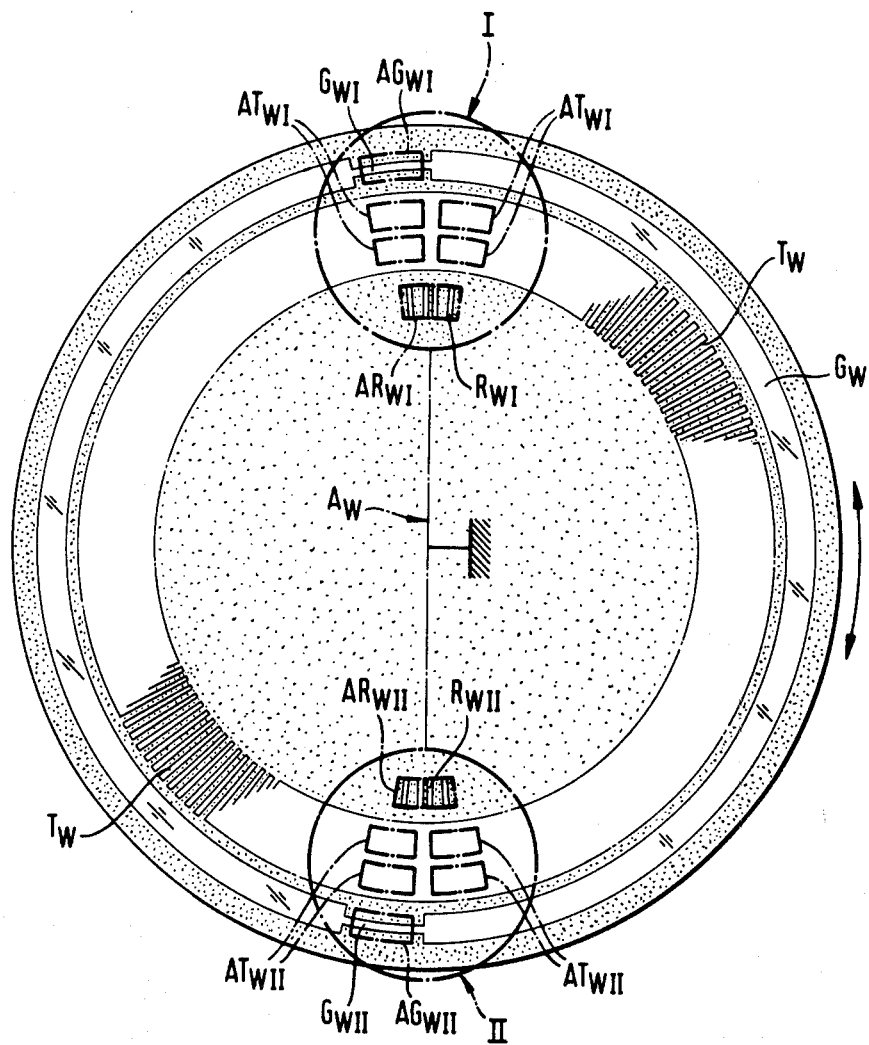
FIG. 3 is a schematic view of an angle measuring device which includes a scanning plate and measuring scale similar to those of FIG. 2.

FIG. 3 represents a second preferred embodiment of this invention which is adapted for measuring angular positions rather than linear positions. Corresponding elements in FIG. 3 are designated with the same reference symbols as those used in FIG. 2 with the additional subscript "W".

FIG. 4 is a wave form diagram which presents the wave forms generated by two of the photosensitive elements (not shown) included in the scanning unit 1: the signal $J_1$ generated by the photosensitive element in scanning region I associated with the reference mark reading field $AR_I$, and the signal $J_2$ generated by the photosensitive element in scanning region I associated with the control track reading field $AG_I$. FIG. 4 presents these two signals $J_1$ and $J_2$ as the measuring scale M is shifted with respect to the scanning unit 1 in the X direction. The following discussion describes the generation of the signals $J_1$ and $J_2$.

Initially, the photosensitive element (not shown) that is associated with the reading field $AG_I$ of the scanning plate A is fully illuminated by the control track G and therefore generates the control signal $J_2$ at a relatively high value. In this position, the reference mark track R is substantially light impermeable, and the photosensitive element (not shown) associated with the reading field $AR_I$ therefore generates a low signal (as shown in FIG. 4). As the measuring scale M moves with respect to the scanning unit 1, the signal $J_2$ is modulated first by the control region $G_{II}$ as it passes the reading field $AG_I$. The reference symbol $J_{GII}$ is used to indicate this modulation in FIG. 4. As the measuring scale M continues its movement, the reference mark $R_{II}$ passes in and out of alignment with the reading field $AR_I$, thereby causing the generation of the reference pulse $J_{RII}$, which is represented in FIG. 4 in the wave form $J_1$. Since the modulation $J_{GII}$ does not correspond in time with the reference pulse $J_{RII}$, the reference pulse $J_{RII}$ is not recognized by the evaluating unit B. As the measuring scale M continues to move with respect to the scanning unit 1, it reaches a point at which the constriction $G_I$ comes into alignment with the reading field $AG_I$ and the reference mark $R_I$ simultaneously comes into alignment with the reading field $AR_I$. Thus, the signal modulation $J_{GI}$ in the wave form $J_2$ appears simultaneously with the reference pulse $J_{RI}$ in the wave form $J_1$. The evaluating unit B includes a trigger circuit of a known type arranged to respond to the simultaneous occurrence of the modulation $J_{GI}$ and the reference pulse $J_{RI}$.

FIG. 5 is a wave form diagram similar to that of FIG. 4 except that FIG. 5 shows corresponding wave forms $J_3$ and $J_4$ associated with the second scanning region II. Thus, $J_4$ shows the output of the photosensitive element (not shown) associated with the reading field $AG_{II}$ and the wave form $J_3$ shows the output of the photosensitive element (not shown) associated with the reading field $AR_{II}$.

In comparing FIGS. 4 and 5 it should be apparent that both references pulses $J_{RI}$ of $J_1$ and $J_{RII}$ of $J_3$ appear simultaneously with modulations $J_{GI}$ of $J_2$ and $J_{GII}$ of $J_4$.

Reference pulses are used in incremental measuring devices to make it possible after operation has been interrupted to calibrate the absolute position of the scanning unit with respect to the measuring scale and to calibrate the system continuously. Accordingly, it is essential that a reference pulse only be recognized when the measuring scale M is in the same position with respect to the scanning plate A. Well known electrical components can be used to generate a summation signal which represents the analog sum of the reference pulses $J_{RI}$ of $J_1$ and $J_{RII}$ of $J_3$ (which appear at the same time and at the same relative position of the measuring scale M and the scanning plate A as described above). This resultant combined reference signal JR always appears clearly and unambiguously when the measuring scale M is in the selected, predetermined position with respect to the scanning plate A.

FIG. 6 represents such a combined reference signal JR, which has been formed by analog addition of the four signals $J_1$, $J_2$, $J_3$, $J_4$ discussed above according to the following formula:

$$JR = (J_1 - J_2) + (J_3 - J_4)$$

The manner in which a single reference mark can be used with a single scanning field to generate a single reference pulse is known to the art. By carefully positioning the reference marks $R_I, R_{II}$ and the respective reading fields $AR_I, AR_{II}$, the embodiment of FIG. 2 is arranged such that each of the reference marks $R_I, R_{II}$ comes into precise alignment with the respective reading field $AR_I, AR_{II}$ simultaneously, and thus two reference signals $J_{RI}, J_{RII}$ are generated simultaneously. As described above, these reference signals are added together as analog signals to produce a single combined reference signal having a high signal level. As shown in FIGS. 4 and 5, the reading fields AG,AR are so positioned in the two scanning regions I,II that there is only one relative position between the scale M and the scanning plate A in which the reading field $AR_I$ is aligned with one of the reference marks $R_I, R_{II}$ and the reading field $AG_I$ is aligned with one of the constrictions $G_I, G_{II}$. This same position is also the only relative position between the scale M and the scanning plate A in which the reading field $AR_{II}$ is aligned with one of the reference marks $R_I, R_{II}$, and the reading field $AG_{II}$ is simultaneously aligned with one of the constrictions $G_I, G_{II}$. By algebraically combining the output signals of the photosensitive elements associated with the reading fields $AG_I$ and $R_I$, it is insured that a combined reference signal with a sufficiently high signal-to-noise ratio is produced only when the reference mark $R_I$ is aligned with the reading $AR_I$ and the reference mark $R_{II}$ is aligned with the reading field $AR_{II}$. When reference mark $R_{II}$ comes into alignment with reading field $AR_I$, the reading field $AG_I$ is not in alignment with either of the constrictions $G_I, G_{II}$, and therefore no suitably high amplitude combined reference signal is evoked. Thus, although each of the reading fields $AR_I, AR_{II}$ may come into alignment with any of a number of separate reference marks $R_I, R_{II}$, a high amplitude combined reference signal is only generated when each of the reading fields $AR_I, AR_{II}$ is aligned with the respective selected one of the reference marks $R_I, R_{II}$. Thus, the generation of a high amplitude combined reference signal is an unambiguous indication that the measuring scale M is in the preselected position relative to the scanning plate A. In the event that one of the lamps $L_1$ or $L_2$ should fail to function, the remaining lamp will cause a combined reference signal still to be evoked at the predetermined position of the scale M relative to the scanning plate A. Of course, the reference mark $R_I, R_{II}$ associated with the failed lamp $L_1, L_2$ no longer evokes any reference signal whatsoever. In the most unfavorable case, the signal level of the combined reference signal JR is therefore reduced. However, by correctly adjusting the trigger threshold of the evaluating unit B this disadvantage can be made inconsequential.

As explained above, in the event one of the lamps $L_1, L_2$ fails the signal level of the combined reference signal JR is reduced. This is because one of the scanning regions I,II drops out of operation and thus only two signals (either $J_1$ and $J_2$ or $J_3$ and $J_4$) contribute to the wave form JR. The illustrated embodiment of FIG. 1 provides a circuit which tends to compensate automatically for the failure of one of the lamps $L_1, L_2$ by increasing the amplitude of the signals generated by the photosensitive elements associated with the remaining lamp. The common resistor V is connected in series between the voltage source and the lamps $L_1, L_2$. When both lamps $L_1, L_2$ are operating, the voltage drop across the resistor V results in a reduced operating voltage for the lamps $L_1, L_2$, which in turn results in a lower brightness of the lamps $L_1, L_2$ and a reduced signal level at the photosensitive elements P. As explained above, the analog addition of the scanning signals provides a signal level that is higher than that of the reduced individual signals. The trigger threshold of the evaluating unit B is set at an appropriate level for this higher signal level obtained from the added signals. On the failure of one of the lamps $L_1, L_2$, the current through and therefore the voltage drop across the resistor V is reduced. For this reason the remaining lamp which is still operating is driven with a higher than normal operating voltage. In this way, the brightness of the remaining lamp is increased and therefore the signal levels of the photosensitive elements P associated with the operative lamp are raised above their normal levels. The relevant characteristic curves show that the remaining lamp driven with the higher than normal operating voltage results in scanning signals which are about equal in magnitude to the scanning signals normally obtained by addition when both lamps $L_1, L_2$ are operating. Thus, the trigger threshold of the evaluating unit B does not have to be altered when one of the lamps $L_1, L_2$ fails. The detailed design of the electrical elements which cooperate here to produce the above-described result lies within the ability of an average worker in the field and will not be described in further detail here.

The present invention is well adapted for use with angle measuring devices, where it serves to increase the accuracy of the measurement by means of multiple scanning as described above. Moreover, by placing the two scanning regions I,II diametrically with respect to the axis of rotation of the scale, the eccentricity error of the measurement is reduced or eliminated. Such a diameter reading for optical angle measuring systems, which is similar in some respects to that of FIG. 3, is described in German Pat. No. 24 54 915.

The preferred embodiment of FIG. 1 includes in the evaluating unit B a circuit which signals the failure of one of the lamps $L_1, L_2$. For example, an indicating light can be illuminated in response to the failure of the associated lamp $L_1, L_2$. Such an indicating means can aid in reliable and timely scheduling of maintenance.

Of course, it should be understood that the reference marks of this invention can also be arranged and scanned on additional tracks positioned either parallel to or concentric with the division grid if desirable in any particular embodiment. Furthermore, the invention is not restricted to photoelectric incremental measuring devices which operate in the transillumination mode described above. Rather, this invention is also well adapted for use in devices that operate in the incident light mode. It is therefore intended that the foregoing detailed description be regarded as illustrative of the presently preferred embodiments but not as limiting. It is intended that the invention be defined not by the foregoing detailed description, but by the following claims, including all equivalents.

I claim:

1. In an incremental photoelectric measuring device for measuring the position of a first object relative to a second object; wherein the device comprises a scale having a division grid and at least first and second reference marks spatially separated along the grid, each of the reference marks comprising a group of irregularly spaced reference lines; and wherein the device further comprises a scanning plate having at least two scanning regions, each having a plurality of scanning fields for scanning the scale including a respective reference mark scanning field, the improvement comprising:

a control track included in the scale, said control track having at least first and second spatially separated control regions having optical characteristics differing from a remaining portion of the control track;

each of said control regions positioned on the scale in association with a respective one of the reference marks, the alignment of the first control region with respect to the first reference mark differing from the alignment of the second control region with respect to the second reference mark;

at least first and second control track reading fields, each included in a respective one of the scanning regions of the scanning plate, said control track reading fields positioned with respect to the reference mark reading fields such that for each of the scanning regions simultaneous alignment between the respective reference mark reading field and one of the reference marks and between the respective control track reading field and one of the control regions is possible only with a respective one of the reference marks and the associated control region.

2. The invention of claim 1 wherein the measuring device is an angular position measuring device for measuring the angular position of the first object relative to the second object about a rotational axis, and wherein the two scanning regions are diametrically positioned with respect to the rotational axis.

3. The invention of claim 1 or 2 wherein the invention further comprises:

first and second light sources, each positioned to illuminate a respective one of the scanning regions;

a resistor having a first terminal connected to a voltage source and a second terminal connected to both the first and second light sources, such that both light sources draw current through the resistor.

4. The invention of claim 1 or 2 wherein the device further comprises two light sources, each positioned to illuminate a respective one of the scanning regions, wherein the invention further comprises:

means for indicating the failure of one of the two light sources.

5. The invention of claim 3 further comprising:

means for indicating the failure of one of the two light sources.

* * * * *